(12) United States Patent
Agnew et al.

(10) Patent No.: US 10,692,717 B2
(45) Date of Patent: Jun. 23, 2020

(54) MINIMIZATION OF CARBON LOSS IN ALD SIO2 DEPOSITION ON HARDMASK FILMS

(71) Applicant: Lam Research Corporation, Fremont, CA (US)

(72) Inventors: Douglas Walter Agnew, Tigard, OR (US); Ishtak Karim, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/458,818

(22) Filed: Jul. 1, 2019

(65) Prior Publication Data

US 2020/0027718 A1 Jan. 23, 2020

Related U.S. Application Data

(63) Continuation of application No. 16/040,495, filed on Jul. 19, 2018, now Pat. No. 10,340,136.

(51) Int. Cl.
*H01L 21/02* (2006.01)
*H01L 21/32* (2006.01)
*H01L 21/033* (2006.01)

(52) U.S. Cl.
CPC .... *H01L 21/0228* (2013.01); *H01L 21/02164* (2013.01); *H01L 21/02211* (2013.01); *H01L 21/02219* (2013.01); *H01L 21/02274* (2013.01); *H01L 21/0337* (2013.01); *H01L 21/32* (2013.01)

(58) Field of Classification Search
None
See application file for complete search history.

(56) References Cited

U.S. PATENT DOCUMENTS

| 8,901,016 B2 | 12/2014 | Ha et al. |
| 9,431,267 B2 | 8/2016 | Trivedi et al. |
| 2014/0210087 A1* | 7/2014 | Kang ............... H01L 23/53233 257/751 |
| 2015/0126042 A1* | 5/2015 | Pasquale ........... H01L 21/02274 438/761 |
| 2015/0200110 A1 | 7/2015 | Li et al. |

OTHER PUBLICATIONS

ISR, PCT/US2019/041262, dated Oct. 31, 2019, 3 pages.

* cited by examiner

*Primary Examiner* — Thien F Tran
(74) *Attorney, Agent, or Firm* — Penilla IP, APC

(57) ABSTRACT

A method for defining thin film layers on a surface of a substrate includes exposing the surface of the substrate to a first precursor via a first plasma to allow the first precursor to be absorbed by the surface of the substrate. A second precursor that is different from the first precursor is applied to the surface of the substrate via a second plasma. The second precursor is a Carbon dioxide precursor that releases sufficient oxygen radicals to react with the first precursor to form an oxide film layer on the surface of the substrate.

16 Claims, 8 Drawing Sheets

1. Incoming wafer with existing pattern of Spin-on hardmask (SOH)

2. SiO2 (oxide film layer) deposited over SOH pattern and substrate.

3. Directional etching to remove top and bottom of SiO2 film leaving only sidewalls of the pattern 4. SOH ashed leaving SiO2 sidewalls of pattern (different separation gaps a, b, c)

1. Incoming wafer with Spin-on hardmask (SOH) - Initial Pattern

Feature profile at various scan points starting from the center of
the substrate to the edge to determine SOH loss SOH loss due to Carbon consumption with various oxidizer
(based on scan from center of substrate to edge of substrate)

MINIMIZATION OF CARBON LOSS IN ALD SIO2 DEPOSITION ON HARDMASK FILMS

CLAIM OF PRIORITY

The present patent application is a continuation of and claims priority, under 35 U.S.C. § 120, to U.S. patent application Ser. No. 16/040,495, filed on Jul. 19, 2018, and titled "Minimization of Carbon Loss in ALD SiO2 Deposition on Hardmask Films," which is incorporated herein by reference in its entirety.

BACKGROUND

1. Field of the Disclosure

The present embodiments relate to semiconductor substrate processing, and more particularly, to low-temperature ALD Deposition of a substrate.

2. Description of the Related Art

There are many types of film deposition processes commonly used in the semiconductor fabrication field to define different types of features. Some example deposition processes to create thin films onto a substrate include chemical vapor deposition (CVD—e.g., plasma-enhanced CVD), physical vapor deposition (PVD) and atomic layer deposition (ALD).

In a PVD process, a pure source material in liquid form is converted into a vapor precursor and delivered to the process chamber. High power electricity, laser ablation are some of the techniques that are used in converting the liquid precursor to the vapor precursor in a controlled manner. The vapor precursor, when applied to a substrate, condenses on the surface of the substrate to create a desired layer. There are no chemical reactions that take place in the entire PVD process.

In the CVD process, a source material is mixed with a volatile precursor that acts as a carrier. The mixture is injected into the process chamber in which the substrate is received, in a gaseous phase to deposit films on substrates. The reactants of the mixture react with the surface of the substrate resulting in the deposition of thin films.

The ALD process is a sub-class of the CVD. The ALD is a cyclic process that is carried out by dividing a conventional CVD process into an iterated sequence of self-saturating deposition cycles. The resulting films are highly conformal, smooth and possess excellent physical properties. Unlike the CVD where the reacting gases are applied into the chamber simultaneously, the reacting gases of the ALD (i.e., precursors) are introduced sequentially to allow the gases to react with the surface of the substrate instead of with each other. ALD process involves a series of pulsing and purging steps in which layers are formed by alternately pulsing precursors, reactive gases one at a time into the process chamber and purging with inert gas in between each pulse. For example, during a first pulsing step, a first precursor is introduced as a gas, which is absorbed (or adsorbed) on a surface of the substrate received within a process chamber. This is followed by a purging step wherein the process chamber is purged of the first precursor using an inert gas. A following pulsing step includes introducing a second precursor as plasma, which reacts with the absorbed precursor to form a monolayer of a desired material (e.g., oxide film (SiO2) layer). A second purging step is performed to remove the second precursor along with any byproducts from the process chamber. By regulating the sequence of pulse and purge, the films produced by ALD are deposited one atomic layer at a time by repeatedly switching the sequential flow of the two or more precursors/reactive gases over the substrate.

Throughput of the typical ALD process is limited due to the limitations of gas switching technology, as well as time required to purge the process chamber between gas switching. In order to meet higher throughput demands of the industry, multiple patterning was instituted. Earliest form of multiple patterning was "pitch splitting," which involved dividing a pattern into two or three parts, processing each of the parts conventionally and combining the parts in a final layer. The main issue with this approach was the feature-to-feature positioning errors. To overcome this issue, a different form of multiple patterning (i.e., double patterning) was developed. In double patterning, a sequence of exposures and etchings of independent patterns are performed on the same layer to define sub-patterns. The resulting pattern is a composite of the etched sub-patterns. By interleaving the sub-patterns, pattern density can be increased. As the demand for sub-atomic pitches increase, improving reliable yield from the multiple patterning becomes critical and the double patterning approach seems to provide a viable and promising option.

It is in this context that the various embodiments of the current disclosure arise.

SUMMARY

Embodiments of the disclosure include deposition processes that can be employed to define features. The defined features are transferred to a semiconductor substrate. In some embodiments, a double patterning technique is used to define the features on the substrate and to increase the feature pattern density. It should be noted that the inventive features are not restricted to the double patterning techniques but can be extended to any deposition process that can be used to create masks for transferring patterns into a substrate.

As device sizes continue to shrink, the acceptable carbon loss and on-substrate feature profile resulting from this carbon loss is increasingly concerning, especially with regards to the maintenance of critical dimensions of features formed on the surface of the substrate. The various embodiments center on the use of carbon-dioxide (CO2) gas as an oxidizing gas for performing low-temperature atomic layer deposition (ALD) of silicon-dioxide (SiO2) over hardmasks patterned on a surface of a substrate. The CO2 is a stable compound that is relatively difficult to break apart in the plasma. By applying high-frequency radio frequency power, a low concentration of reactive Oxygen radicals are released into the plasma from the carbon-dioxide gas to enable the Oxygen radicals to saturate the surface of the substrate without consuming the carbon from the hardmask layer. The lower concentration of reactive Oxygen radicals in the CO2 plasma ensures that the critical dimensions of the hardmask layer is substantially preserved. More importantly, the resulting etch profile is highly planar, which is otherwise difficult to achieve in standard ALD processes.

A first precursor is supplied via a first plasma to a process chamber in which a substrate is received, so as to allow the first precursor to be absorbed by the surface of the substrate. Then a second precursor in which carbon-dioxide (CO2) is co-flowed with an inert gas, such as Argon, is supplied to the process chamber and a high-frequency radio-frequency (HF-RF) power is struck to generate a second plasma that is used to saturate the surface of the substrate on which the first precursor is absorbed, to define an oxide film layer. This process of applying the first precursor followed by the second precursor is repeated resulting in the step-wise atomic layer growth that is intrinsic to the ALD processes. Due to lower concentration of reactive Oxygen radicals in the CO2 plasma, a much smaller degree of carbon consumption is observed at the hardmask layer while a substantially uniform and highly planar etch profile is observed on the substrate surface at both the center and the edge of the substrate.

The various embodiments offer a simple and easily implementable method of depositing thin films (e.g., SiO2 films) on hardmask features defined on a substrate surface with significantly less feature profile loss at the hardmasks as compared to conventional deposition processes. Carbon-dioxide (CO2), used as the active oxidant in the various embodiments described herein, is a widely available inexpensive gas that poses minimal challenges in safe handling. Additional benefit of using the CO2 as the oxidant is that there is no need to configure a new process chamber or to reconfigure an existing process chamber to accommodate the change in the oxidizing chemistry, as the existing process chamber used for ALD process can be effectively used in the implementation of the various embodiments.

In one implementation, a method of depositing films over a substrate received within a process chamber, is disclosed. The method includes processing the substrate to expose a surface of the substrate and a spin-on hardmask (SOH) patterned thereon to a first precursor via a first plasma. The first precursor gets partially absorbed on the exposed surfaces to form silicon-hydrogen bonds on the exposed surfaces, including the surface of the substrate and surfaces of the SOH. The SOH patterned on the substrate surface has an initial pattern. The method further includes processing the substrate to expose the surface of the substrate and the surfaces of the SOH to a second precursor via a second plasma. The second precursor is different from the first precursor and includes a mixture of carbon-dioxide gas and an inert gas. The processing causes Oxygen radicals to be released and react with the silicon-hydrogen bonds formed on the surface of the substrate and the surfaces of the SOH. The Oxygen radicals react with the silicon-hydrogen bonds to form an oxide film layer without substantially consuming a surface thickness of the initial pattern of the SOH.

In some implementations, the processing of the substrate with the first precursor followed by the processing of the substrate with the second precursor are repeated a number of times to grow the oxide film layer to an oxide thickness over the surface of the substrate and the surfaces of the initial pattern of the SOH. The processing using the first and the second precursors is repeated to conform to the atomic layer deposition process.

In some implementations, the oxide thickness of the oxide film layer is comparable to a thickness of the SOH in the initial pattern and is based on a pitch of the SOH in the initial pattern.

In some implementations, a directional etching is performed to selectively etch the oxide film layer to expose a top of the initial pattern of the SOH and the surface of the substrate. After the directional etching, an ashing operation is performed to remove the initial pattern of the SOH, so as to leave oxide sidewalls from the oxide film layer. The oxide sidewalls define a self-aligned double pattern.

In some implementations, a purging operation is performed after processing the substrate with the first precursor so as to purge any unabsorbed first precursor from the process chamber. The purging operation is performed prior to processing the substrate with the second precursor.

In some implementation, a purging operation is performed to purge the second precursor and any byproducts from the process chamber after exposing the surface of the substrate and the surfaces of the SOH to the second precursor for a predefined period of time.

In another implementation, a method of depositing films over a substrate received within a process chamber, is disclosed. The method includes processing a surface of the substrate and a spin-on-hardmask (SOH) patterned thereon to an Aminosilane precursor via a first plasma to allow Aminosilane precursor to get partially absorbed on the exposed surfaces to form silicon-hydrogen bonds on the exposed surfaces, including the surface of the substrate and surfaces of the SOH. The SOH patterned on the substrate surface has an initial pattern. The method further includes processing the substrate to expose the surface of the substrate and the surfaces of the SOH to a second precursor via a second plasma. The second precursor includes a mixture of carbon-dioxide gas and Argon gas. The processing causes Oxygen radicals released from the carbon-dioxide gas to react with the silicon-hydrogen bonds formed on the surface of the substrate and the surfaces of the SOH to form an oxide film layer on the surface of the substrate and the surfaces of the SOH. The oxide film layer is formed without substantially consuming a surface thickness of the initial pattern of the SOH.

In some implementations, the SOH is a carbon-based SOH.

In some implementations, the second precursor is introduced into the process chamber by adjusting a flow rate of the carbon-dioxide in the second precursor to be between about 500 sccm to about 3000 standard cubic centimeters (sccm), and adjusting a flow rate of the inert gas of the second precursor to be between about 5000 sccm and about 20,000 sccm.

One advantage of using a weak oxidizer, such as carbon-dioxide gas, is to minimize consumption of the carbon-based SOH so as to preserve the critical dimensions of the initial pattern. Carbon-dioxide being a widely available, inexpensive gas poses minimal challenges in safe handling. The process chamber does not have to be re-designed and there is no need to develop new hardware to handle the carbon-dioxide, as the existing process chamber can be used to handle the carbon-dioxide precursor. Due to lower concentration of reactive Oxygen radicals in the second precursor plasma, a much smaller degree of carbon consumption is observed at the initial pattern. This results in an etch-profile that is highly planar across the substrate surface, an otherwise difficult result to achieve in conventional ALD processes. Further, the deposition cycle times are similar to conventional ALD processes and, as such, does not adversely affect the throughput. These and other advantages will be discussed below and will be appreciated by those skilled in the art upon reading the specification, drawings and the claims.

DESCRIPTION

Figure 1:
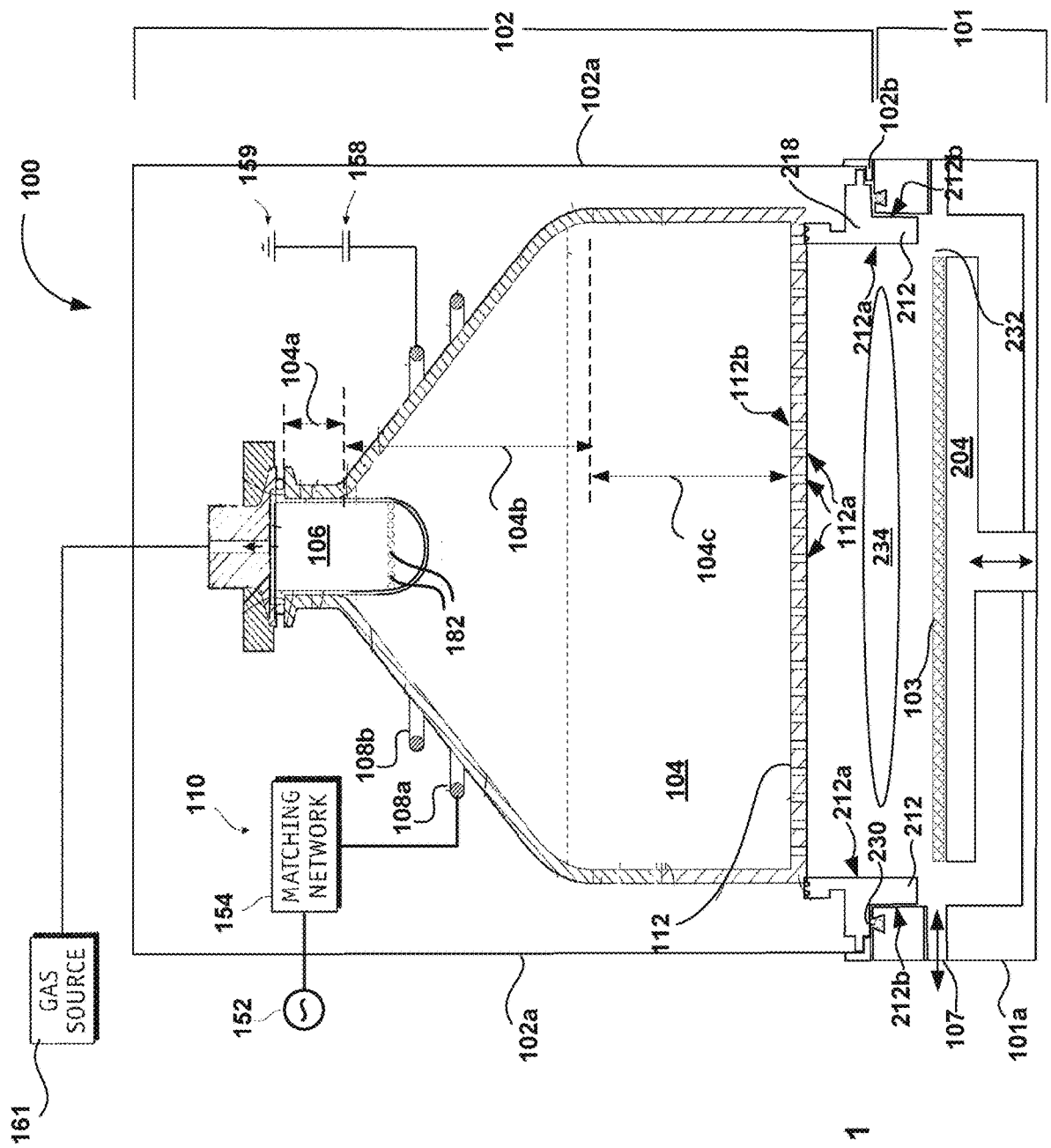
FIG. 1 illustrates a vertical cut-out view of a processing region defined within a substrate processing system that is configured to perform a deposition process on a substrate to form films thereon, in one implementation.

In the following description, numerous specific details are set forth in order to provide a thorough understanding of the present inventive features. It will be apparent, however, to one skilled in the art that the present disclosure may be practiced without some or all of these specific details. In other instances, well known process operations have not been described in detail in order not to unnecessarily obscure the present disclosure.

Various implementation of the disclosure provide details of a refined atomic layer deposition process that is used to deposit thin films on a surface of a substrate received inside a process chamber. In some implementation described herein, the inventive features are implemented within a double patterning technique that is used to define the features on the substrate. The inventive features described herein are not restricted to deposition processes or specific patterning techniques but can be extended to other processes or patterning techniques, including triple-patterning, pitch-splitting, etc., where carbon depletion from the features formed on a substrate surface are of concern.

The various embodiments center on the use of carbon-dioxide as an oxidizing gas for performing low-temperature atomic layer deposition (ALD) of an oxide film layer, such as silicon-dioxide (SiO2), on carbon-based spin-on-hardmask (SOH) defining an initial pattern. Conventional deposition processes used strong oxidizers, such as Nitrous Oxide or Oxygen. In the plasma, due to the weak bond, the Nitrous Oxide disassociates easily into Nitrogen and highly reactive Oxygen radicals. Compared to the Nitrous Oxide, Oxygen has a slightly stronger bond. However, Oxygen also easily breaks down in the plasma to release highly reactive Oxygen radicals. The released reactive Oxygen radicals assist in saturating the surface of the substrate to form the oxide film layer, such as SiO2 film layer. Although, having greater amount of radical-type Oxygen species (co-reactant in the ALD SiO2 deposition) assist in effective saturation of the surface of the substrate, a high concentration of the reactive Oxygen radicals in the plasma has also be known to consume carbon from the Carbon-based hardmask (via combustion) that define the initial pattern on the substrate. These hardmasks are used in transferring features onto the substrate and consumption of the carbon affects the critical dimensions of the initial pattern formed by these hardmasks. As device sizes continue to shrink, the acceptable carbon loss from Oxygen etch and on-substrate feature profile resulting from this carbon loss becomes increasingly concerning, especially with regards to maintaining critical dimensions of features formed on the surface of the substrate.

Using carbon-dioxide as the main oxidizer in a second precursor used in the deposition process results in a low concentration of reactive Oxygen radicals to be released into the plasma for saturating the surface of the substrate. Carbon-dioxide (CO2) is co-flowed with an inert gas, such as Argon, and a high-frequency radio-frequency (HF-RF) plasma is struck to release the Oxygen radicals from the CO2 into the plasma. The released Oxygen radicals react with a layer of a first precursor deposited on the surface to define step-wise atomic layer growth that is intrinsic to the ALD processes. Due to lower concentration of reactive Oxygen radicals in the CO2 plasma, a much smaller degree of carbon consumption is noticed at the hardmask layer while a substantially uniform and highly planar feature profile is observed across the substrate surface (including the center of the substrate and the edge of the substrate).

One of the advantages realized from the various implementations is that it offers a simple and easily implementable method of depositing thin films (e.g., SiO2 films) on carbon-based hardmask features defined on a substrate surface with significantly less feature profile loss at the hardmask layer as compared to conventional deposition processes. Another advantage is that carbon-dioxide (CO2), which is used as the active oxidant in the various embodiments described herein, is a weak oxidizer that is a widely available inexpensive gas that poses minimal challenges in safe handling. Additional benefit of using the CO2 as the oxidant is that there is no need to configure a new process chamber or to reconfigure an existing process chamber to accommodate the change in the oxidant chemistry, as the existing process chamber used for ALD process can be effectively used in the implementation of the various embodiments. Other advantages will be realized by those skilled in the art upon reading the specification, drawings and the claims The various embodiments can be implemented in a single station process chamber as well as a multi-station process chamber. The multi-station process chamber may include two or more stations, with the stations being arranged in a linear, circular or in any geometric configuration with a rotating or moving mechanism disposed therein. In some implementations, the multi-station process chamber may include 4 stations with each station arranged in a circular configuration with a rotating mechanism disposed at a central location. A pedestal or a substrate supporting surface is provided in each station for supporting a substrate. Each pedestal is disposed in a lower chamber body of the process chamber, and each pedestal may include a carrier ring. The lower chamber body includes outer walls and inner walls to isolate each of the pedestals of the four stations. A ground plate is disposed over the inner walls and attached to the outer walls. The ground plate has a center opening and a process opening for each station. The center opening at the center location is configured to receive at least a portion of the rotating mechanism. The process opening at each station has a diameter that is larger than a diameter of the carrier ring. For radio frequency power applied to the process chamber, an RF ground return is provided via the ground plate that symmetrically surrounds each process opening of each station.

In one configuration, the process chamber may include spider forks, one for each station, to lift a carrier ring disposed around respective pedestals of each of the stations. In a specific configuration wherein the process chamber includes four stations, the spider forks can simultaneously lift each of the four carrier rings (and any substrate disposed thereon), and the rotating mechanism may be used to rotate all of the carrier rings and substrates to the next station (e.g., for additional or different processing). In one configuration, the chamber has loading and unloading stations when one substrate is loaded at a time or can include parallel loading and unloading stations where two or more substrates are loaded and unloaded at a time.

It should be appreciated that the present embodiments can be implemented in numerous ways, such as a process, an apparatus, a system, a device, or a method. Several embodiments are described below.

FIG. 1 illustrates a substrate processing system 100, which is used to process a substrate 103, in one implementation. The system includes a process chamber having a chamber wall 101a that defines a lower chamber portion 101 and a chamber wall 102a that defines an upper chamber portion 102. The lower chamber portion 101 houses a pedestal 204 that provides a support surface to support the substrate 103 when received in the process chamber for processing. It should be noted that the embodiment illustrated in FIG. 1 is a single-station process chamber. The lower chamber portion includes a lifting/rotating mechanism (such as spider forks (not shown)) to lift a carrier ring disposed around the pedestal 204 along a vertical axis and to rotate the lifting mechanism along a horizontal axis, and facilities and controls (not shown) to operate different components of the system 100, including controls to operate the lifting mechanism, controls to supply power to different components of the system, etc.

The upper chamber portion 102 houses a showerhead 112. The showerhead 112 is disposed above the substrate support surface of the pedestal 204 so as to define the processing region 234 there-between. The showerhead 112 includes a plurality of nozzles 112a that are used to supply gaseous precursors and/or plasma to the processing region 234. In one embodiment, immediately above the showerhead 112 is a plasma chamber 104 that is configured to receive gas chemistry and generate plasma. The plasma chamber 104 is coupled to a gas source, such as a reservoir (161) of the gas chemistry. A gas flow distribution receptacle in the form of a diffuser 106 is provided within the plasma chamber 104. The diffuser 106 may have any number of shapes. In one embodiment illustrated in FIG. 1, the diffuser 106 includes a cup-shaped member having a rounded bottom section and a cylindrical top section. The diffuser is made of a non-conductive material capable of withstanding corrosion when exposed to the gas chemistry. The diffuser 106 includes a plurality of injection openings 182 to diffuse the gas chemistry that is being introduced into the plasma chamber 104. In some embodiments, the plurality of injection openings 182 is disposed along a horizontal ring in the rounded bottom section of the cup-shaped member, as shown in FIG. 1. In other embodiments, the plurality of injection openings 182 is disposed throughout the cup-shaped member.

In the embodiment illustrated in FIG. 1, a single diffuser 106 is shown, wherein the diffuser 106 is used to sequentially introduce both a first precursor and a second precursor. In other embodiments, a different diffuser 106 may be used, with a first diffuser 106 used to introduce the first precursor and a second diffuser 106 to apply a second precursor to the plasma chamber. The gas chemistry may be diffused using the diffuser 106 before introducing into the plasma chamber 104. The diffuser 106 may have a distinct shape. In one embodiment, the diffuser 106 may have a rounded bottom section (i.e., cup-shaped section) and a cylindrical top section, and be made of a non-conductive material that is capable of withstanding corrosion when exposed to the gas chemistry included in the precursors used in the processing of the substrate 103. Suitable materials for the diffuser 106 include, for example, dielectric materials, such as quartz.

In one embodiment, the plasma chamber 104 is shaped in the form of a cone with a narrow neck section 104a at the top in which the diffuser 106 is disposed, a conical section 104b immediately below the narrow neck section 104a, and a broader cylindrical section 104c at the bottom immediately below the conical section 104b and above a top surface 112b of the showerhead 112. An outer diameter of a cylindrical top section of the diffuser 106 may be less than the inner diameter of the narrow neck section 104a of the plasma chamber 104 so that the diffuser 106 can be easily received into the narrow neck section 104a. Injection openings 182 may be distributed throughout the diffuser 106 or radially in a cup-shaped bottom section to allow an even distribution of the gas chemistry from the reservoir to the plasma chamber 104.

One or more coils 108 (108a, 108b shown in FIG. 1) are disposed to encircle a portion of the conical section 104b of the plasma chamber 104. The coils 108 are coupled to an energy source 110, which supplies the electricity to the coils 108. Electric field supplied by the energy source 110 is selectively applied by the coil 108 to energize the coil 108 and an electric field is formed in the conical section 104b of the plasma chamber 104 encapsulated by the coil 108. The electric field ionizes the gas chemistry received in the conical section 104b of the plasma chamber 104 to generate plasma. The generated plasma may include reactive species, such as electrons, ions, excited species, reactive radicals, disassociated radicals and/or neutral species. The generated reactive species are distributed to a processing region 234 of the process chamber through the nozzles 112a of the showerhead 112 that is integrated with the cylindrical section 104c of the plasma chamber 104. A top surface of the substrate exposed to the reactive species absorbs the reactive species to define a layer of material.

In some implementations, the chamber wall 102a that defines the upper chamber portion 102 may include a spacer 212 disposed immediately below the showerhead 112 and between the showerhead 112 and the chamber wall 101a of the lower chamber portion 101. In such implementations, the spacer 212 may include an annular body that is disposed along an outer periphery of a bottom surface of the showerhead 112 facing the pedestal 204. The spacer 212 may be attached to the bottom surface of the showerhead 112 either through mechanical means or non-mechanical means. The spacer 212 is disposed at the bottom surface of the showerhead 112 so as to define a gap 232 between the inner sidewall 212a of the spacer and an outside edge of a support of the pedestal 204 disposed in the lower chamber portion 101. The gap 232 is defined to allow the gas chemistry (i.e., precursors) to flow out of the processing region 234 through the gap 232 toward a drain (not shown) defined in the lower chamber portion 101. A vacuum pump (e.g., a one or two stage mechanical dry pump and/or a turbomolecular pump) is used to draw gas chemistries out of the processing region in order to maintain a suitably low pressure within the process chamber.

In some implementations, in a disengaged position of the process chamber (i.e., when the upper chamber portion is disengaged), a bottom surface of the spacer 212 inside the process chamber is above and toward a lateral side of a top support surface of the pedestal 204, such that the gap 232 exists between an outside edge of the support surface of the pedestal 204 and the sidewall of the spacer 212. In the engaged position, the support surface of the pedestal 204 is at a higher level than the bottom surface of the spacer 212. An inner sidewall 212a of the annular body of the spacer 212 is exposed to the gaseous chemistry applied to the processing region 234. A side extension 218 extending from an outer sidewall 212b of the spacer 212 may be configured to sit on top of the chamber wall 101a of the lower chamber portion 101, when the upper chamber portion 102 is lowered. Grooves may be defined in the side extension 218 of the outer sidewall 212b of the spacer 212 in which one or more rings may be received to seal the processing region 234, when the upper chamber portion is lowered. The lower chamber portion includes an opening 107 that allows unhindered movement of the substrate 103 into and out of the process chamber.

In the embodiment illustrated in FIG. 1, the plasma chamber 104 is included in the upper chamber portion 102 and is disposed immediately above a showerhead 112 so that plasma may be generated within by applying power, such as high-frequency, radio-frequency (HF-RF) power in the plasma chamber. In another embodiment, the plasma may be generated remotely and applied to the plasma chamber 104. In this embodiment, the plasma chamber 104 may be a stand-alone module that is coupled to the showerhead 112 of the system 100. The plasma generated remotely (i.e., away from the processing region) is supplied to the processing region 234 through the showerhead 112.

The plasma chamber 104 is made of a dielectric material. Sidewalls of the plasma chamber 104 may have a thickness that is suitable for generating plasma of the precursors introduced into the plasma chamber 104 from any one of the gas sources 161. Although only one gas source 161 is shown in FIG. 1, it should be understood that additional gas sources 161 may be included to provide the different gas chemistries, depending on the type of fabrication operation (e.g., ALD deposition process using two or more precursors) performed in the process chamber. For the ALD deposition process, the plasma chamber 104 may be used to introduce a first precursor and a second precursor. In this embodiment, the first precursor is supplied in gaseous form by a first gas source 161a (not shown). The gaseous form of the first precursor may be converted into plasma by application of power from the coil 108 and provided to the processing region 234 as plasma via the showerhead 112. The first precursor is purged from the processing region 234 and a second precursor may be supplied to the plasma chamber 104 from a second gas source 161b (not shown). The second precursor may be converted into plasma form and provided to the processing region 234 to allow the second precursor to react with the first precursor absorbed on the surface of the substrate.

The shape of the plasma chamber assists in directing the plasma through the showerhead 112 toward the processing region 234. The plasma chamber 104 illustrated in FIG. 1 is conical shaped and includes an upper, narrow neck section 104a, a middle conical section 104b and a lower cylindrical section 104c. The sidewalls of the different sections of the plasma chamber 104 along an axial length may be of uniform thickness or the thickness may vary from one section to another. The axial lengths of each of the different sections of the plasma chamber 104 may be equal or may vary, depending on dimensions of surrounding components of the process chamber. A diameter of the upper, narrow neck section 104a is substantially uniform. The diameter of the middle conical section 104b increases from the upper, narrow neck section to the lower cylindrical section 104c. The diameter of the lower cylindrical section 104c is substantially uniform and is sized to cover at least a diameter of the processing region 234 or at least a diameter of the substrate 103 that is received on the substrate support system 204 (i.e., pedestal) disposed in the lower chamber portion 101.

In one embodiment, the showerhead 112 may have a plate-like configuration and include a plurality of nozzles disposed uniformly along a bottom surface for dispensing the various precursors to the processing region 234. In an alternate embodiment, the showerhead 112 may have a bottom curved surface and include a plurality of nozzles distributed uniformly throughout to provide focused application of the precursors onto the surface of the substrate 103 when received on the pedestal 204. Although, the plasma chamber is represented to include a conical shape, other shapes may also be envisioned, including a dome shape, a cuboidal shape, etc. In the case of the dome or cuboidal shape, there may not be an upper, narrow neck section 104a. The plasma In one embodiment, the coil 108 is disposed on the outside of the middle conical section 104b of the plasma chamber 104 substantially encircling it. Electric field provided to the coil 108 is sufficient to generate plasma within the plasma chamber 104. The coil 108 is connected to an energy source 110 to provide an electric field to the gas chemistry/chemistries that flows through the conical section 104b of the plasma chamber 104. The energy source 110 may be a high-frequency, radio frequency (HF-RF) power source or other power source capable of energizing the coil 108 to form an electric field. In some embodiments, the coil 108 is a single member made of a conductive material, such as copper, that is wound once around the conical section 104b of the plasma chamber 104. In another embodiment, the coil 108 is wound twice around the conical section 104b of the plasma chamber 104. In this embodiment, a first end of the coil 108 is electrically coupled to the energy source 110, a second end is coupled to an electrical ground 159 and the length of the coil 108 is wound twice (108a, 108b portion of the coil 108) around the conical section 104b of the plasma chamber 104. In some embodiments, the second winding may be above or below the first winding. In some embodiments, a capacitor 158 may be disposed between the second end of the coil 108 and the electrical ground 159 so as to limit the voltage flow through the coil 108 to a threshold voltage. The capacitor 158 may be strategically placed closer to the electrical ground as opposed to between the energy source 110 and the first end of the coil 108, to enable using a lower voltage to form plasma in the plasma chamber. Due to the geometry of the conical section 104b, a diameter of the first winding is larger or smaller than the diameter of the second winding depending on the first winding being below or above the second winding.

In an alternate embodiment, instead of a coil 108 being wound around the conical section 104b twice, two coils 108a, 108b, may be disposed such that each coil (108a, 108b) is wound around the conical section 104b of the plasma chamber 104 once or multiple times. As in the case with a single coil, a first end of each of the two coils 108a, 108b is connected to the energy source 110, and the second end of each of the two coils 108a, 108b is connected to the electrical ground 159. In an alternate embodiment, the coil may be disposed on the inside of the plasma chamber 104 and configured to provide the power to the precursors received in the plasma chamber 104.

The energy source 110 may include an RF generator 152 that is capable of operating at a desired frequency. In some implementations, the energy source 110 is configured to operate at a frequency range of between about 0.2 MHz to about 20.0 MHz. In specific implementations, the energy source 110 is capable of operating at a standard high frequency of about 13.5 MHz). A matching network 154 may be disposed between the RF generator 152 and the coil 108. The matching network 154 may be an impedance matching network that is configured to match an impedance of the RF generator 152 to an impedance of the coil 108. The energy source 110 may be controlled by a control module, e.g., a controller (not shown). The control module is configured to operate the substrate processing system 100 by executing process input and control. The process input and control may include process recipes, such as power levels, timing parameters, pressure, temperature within the process chamber and the plasma chamber, process gases (i.e., precursors) concentration, flow rate of process gases, mechanical movement of the substrate, etc., so as to deposit or form films over the substrate 103 via ALD methods.

Further, the process gases used in the precursors may be premixed prior to introduction into the plasma chamber, in some implementations. In other implementations, the process gases may be individually supplied to the plasma chamber by adjusting the flow rate of the individual gases. The flow rate of the premixed or individual gases into the plasma chamber may be controlled by employing appropriate valving and mass flow control mechanisms. The process input and control executed by the control module ensures that correct concentrations of the different gases are delivered as precursors during different deposition phases of the ALD process. Process gases exit chamber via the gap 232 and the drain. A vacuum pump (e.g., a one or two stage mechanical dry pump and/or a turbomolecular pump) may be used to draw process gases out in order to maintain a suitably low pressure within the process chamber.

In some implementations, the substrate is received directly on the pedestal 204. In such implementations, the pedestal may include lift pins (not shown) that are controlled by a lift pin control mechanism disposed in a center column of the pedestal. The lift pins may be used to raise or lower the substrate 103 received on the pedestal 204. In other implementations, the substrate is disposed on a carrier plate that is received on the pedestal 204. In such implementations, spider forks may be disposed to surround the carrier plate received on the pedestal 204. The carrier plate may include a plurality of contact support structures that are configured to lift the substrate when the carrier plate is lifted by the spider forks.

The substrate 103 may be made of relatively pure silicon, germanium, gallium, arsenide, or other semiconductor material typically used in the semiconductor industry, or of silicon admixed with one or more additional elements, such as germanium, carbon, and the like. In one embodiment, the substrate received into the process chamber for further processing has a previously deposited hardmask layer. The hardmask layer is carbon-based hardmask layer that was deposited using any known fabrication process and includes features that define an initial pattern.

It will be appreciated that FIG. 1 illustrates one embodiment of the process chamber in which plasma chamber components are integrated. In alternate embodiments, process chamber having additional components or components shaped differently than those shown in FIG. 1 may be employed, in addition to the plasma chamber. In yet another embodiment, the plasma chamber 104 may be a stand-alone chamber that is connected to the showerhead 112 of the process chamber to supply remotely-generated plasma to the processing region 234.

With the general understanding of the process chamber employed for performing ALD deposition process, details of an ALD deposition process will now be discussed with reference to FIGS. 2A-I through 2D-E. FIGS. 2A-I through 2D-I show the results of the ALD process using conventional oxidants in the inside portion of the substrate (i.e., substrate or wafer center) and FIGS. 2A-E through 2D-E show the ALD process results at the edge of the substrate (i.e., substrate or wafer edge).

Figure 2A:
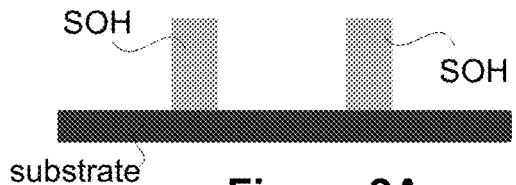
FIGS. 2A-2D illustrate the profile of the spin-on-hardmask (SOH) pattern defined on the substrate showing significant SOH loss due to usage of conventional oxidizers.

FIG. 2A illustrates the beginning of the conventional ALD process that employed a double patterning technique, to deposit film layers on a surface of a substrate. The process starts with a substrate being received into a process chamber. The substrate received in the process chamber may have already undergone a fabrication operation wherein a spin-on-hardmask (SOH) layer was formed on the surface of the substrate. The SOH layer may include features defining an initial pattern. The features defined in the center of the substrate and at the edge of the substrate may have similar critical dimensions represented by the feature thickness and height, as shown in FIG. 2A.

Figure 2B:
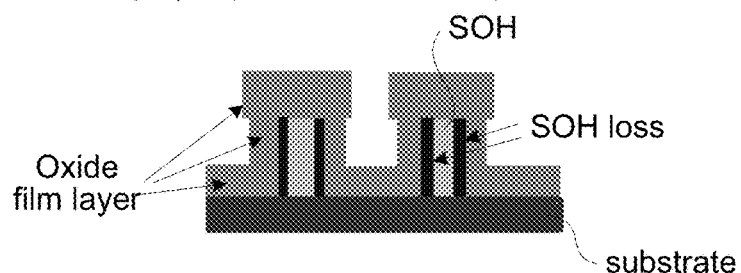

The substrate undergoes the conventional ALD process within the process chamber. As part of the conventional ALD process, the substrate surface with the initial pattern was exposed to a first precursor and a second precursor sequentially. The conventional ALD process used strong oxidants in the second precursor, such as a Nitrous oxide precursor or an Oxygen precursor. The strong oxidants were used to provide a higher concentration of Oxygen radicals in order to saturate the surface of the substrate. The Nitrous oxide precursor is a more reactive oxidizer as it disassociates easily to generate Oxygen radicals. The Oxygen precursor is a little more stable than the Nitrous oxide precursor due to the strong bond between the Oxygen atoms, but is considered a strong oxidant as it disassociates fairly easily to provide highly reactive Oxygen radicals. The Oxygen radicals released into the plasma by the Nitrous oxide or Oxygen gas in the second precursor readily saturated the substrate surface, where it reacted with the first precursor absorbed on the surface of the substrate to form an oxide film layer, as shown in FIG. 2B. However, as part of saturating the surface of the substrate, the Oxygen radicals also consumed the carbon material of the SOH layer, thereby affecting the critical dimensions of the features formed by the SOH layer. The solid dark grey line shown in FIG. 2B represents the SOH loss due to carbon consumption at the sidewalls of the SOH feature during formation of the oxide film layer. The thickness of the solid grey line is indicative of the amount of carbon consumption at the sidewalls of the SOH features. Further, the carbon consumption at the sidewalls may vary for the SOH features defined at the substrate center as opposed to the substrate edge. The variation in the thickness of carbon consumption may be due to a prolonged exposure to the second precursor for the features at the substrate edge than at the substrate center, based on the way the second precursor was applied and removed.

Figure 2C:
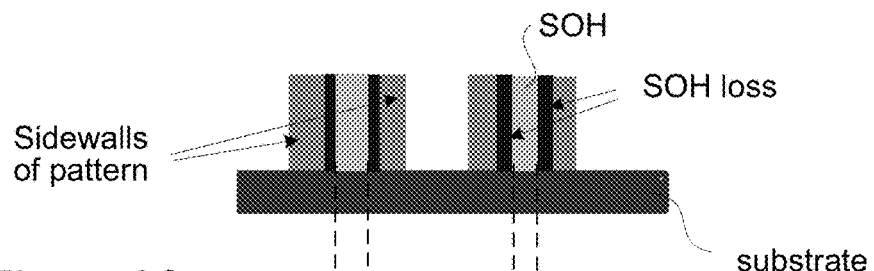
Figure 2D:
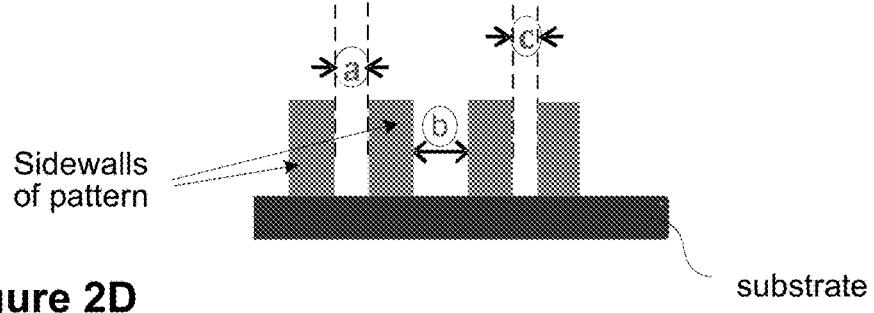

Following the formation of the oxide film layer, a directional etching operation was performed at the substrate surface to remove the oxide film layer from a top of the surfaces of the substrate and the SOH features while leaving the oxide film layer on the sidewalls of the pattern, as shown in FIG. 2C. Finally, an ashing operation was performed to selectively remove the SOH defining the features of the initial pattern and to leave the oxide film layer forming the sidewalls. FIG. 2D show the resulting pattern (e.g., a line pattern) as a result of the ashing operation. However, due to the carbon consumption by the strong oxidants used in the second precursor, the critical dimensions of the features defined in the resulting pattern (represented by gaps a, b and c) were non-uniform. As a result, when the resulting pattern was transferred to the substrate below to define features on the substrate, the pattern that was transferred was irregular (i.e., non-uniform) causing bar profile issues.

Due to the high affinity and reactivity of carbon to the Oxygen radicals, attaining a satisfactory deposition process by limiting SOH damage using conventional oxidants (e.g., N2O, O2) is difficult and requires significant process tuning, and in some cases, new hardware development. As device sizes continue to shrink, the acceptable loss and on-substrate profile of this carbon loss becomes increasingly important with regards to maintaining the critical dimensions between features.

To overcome the disadvantages of the conventional process, the inventive feature used Carbon dioxide (CO2) as the main oxidant gas in the low-temperature atomic layer deposition (ALD) of oxide film layer (e.g., SiO2 film layer) on SOH. Carbon dioxide being a weak oxidant releases less reactive Oxygen radical species into the plasma. By virtue of the lower concentration of the Oxygen radicals in the plasma, usage of a weak oxidant, such as CO2, in the ALD process ensures a limited damage to SOH. Further, the resulting etch-profile is highly planar, which is otherwise difficult to achieve in conventional ALD processes that used the strong oxidants, such as N2O and O2, as the strong oxidants consumed the carbon of the SOH. Substituting strong oxidants, such as N2O and O2, with weak oxidants, such as CO2, offers a simple and easily implementable method of depositing thin oxide film layers (such as SiO2 film layers) on SOH with significantly less loss to the hardmask compared to the conventional ALD processes. CO2 is a widely available inexpensive gas that poses minimal challenges in safe handling. Further, the existing process chamber can be used to handle the CO2 with minimal adjustments made to the process recipe at the controller. There is therefore no need to develop new hardware or to re-design the existing hardware.

FIGS. 3A-3D illustrate an ALD process that employs a weak oxidant in the second precursor, in order to limit the carbon consumption at the SOH features of the initial pattern defined on the substrate surface, in one embodiment. Mitigating the carbon consumption would result in a more planar etch-pattern to be defined on the substrate, which translates into a uniform pattern mask for etching the substrate. As a result, when the pattern mask is transferred to the substrate, the features are more uniform and have reliable profile geometry.

The embodiment illustrated in FIGS. 3A-3D is described with reference to a multi-patterning technique used to define features on a surface of a substrate and transmitting the resulting pattern to the substrate to etch the features on the substrate. For example, the multi-patterning technique that is used relates to self-aligned double patterning (SADP) technique that involves using an initial pattern of features of a particular density (i.e., pitch) defined on a surface of the substrate, to generate a modified pattern with twice the density of the initial pattern. The resulting modified pattern is planar and uniform in feature geometry.

The ALD process used for depositing a silicon-based oxide film layer on a substrate is carried out over several cycles with each cycle consisting of exposing a surface of the substrate to a first plasma of a first precursor, (e.g., an organometallic silicon precursor), and then applying a second plasma of a second precursor that is different from the first precursor. There are a number of organometallic silicon precursors that can be used in the deposition process and a specific organometallic silicon precursor (e.g., aminosilane) may be selected based on characteristics of the precursor.

Constitution and application of the second precursor causes a uniform oxide film layer to be formed on the substrate surface, with minimum consumption of the carbon-based SOH layer. The weak oxidant used in the second precursor ensures optimal saturation of the Oxygen radicals on the surface of the substrate to provide a more uniform oxide film layer while minimizing consumption of the SOH features. An initial purge operation is initiated between the operation of processing the substrate surface with the first precursor and the operation of processing the substrate surface with the second precursor, with an additional purge step following the second precursor application operation. The initial purge step is carried out to empty the process chamber so as to avoid the unabsorbed first precursor from reacting with the second precursor, that can result in the formation of undesirable byproducts or impurities.

Figure 3A:
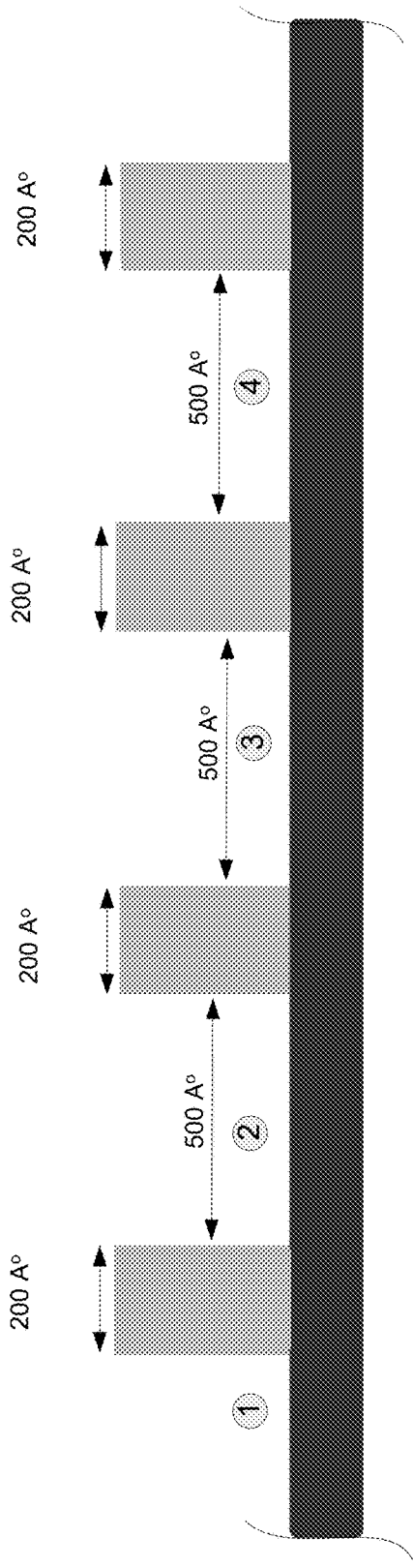
FIGS. 3A-3D illustrate the profile of the features defined on the substrate resulting from usage of CO2 as an oxidizer, in accordance with one implementation.

FIG. 3A illustrates the surface of the substrate at the beginning of a low-temperature ALD process. The substrate may have already undergone a fabrication operation, wherein a spin-on hardmask (SOH) layer was deposited on the surface to define an initial pattern of features, prior to being received in the process chamber to start the ALD process. The SOH layer formed on the substrate surface is a carbon-based hardmask. The features formed on the surface have defined critical dimensions including at least a height, a width and density (i.e., a pitch defining a distance separating each pair of consecutive features). For instance, the width of each feature may be about 200 A° and the distance between a pair of consecutive SOH features may be about 500 A°. The SOH layer may be defined using a photoresist operation or any other fabrication operation.

The surface of the substrate undergoes an ALD process to deposit an oxide film layer by exposing the surface of the substrate to two or more precursors sequentially. As part of the ALD process, the surface of the substrate, including surfaces of the SOH features defining the initial pattern, is exposed to a first precursor. The first precursor is selected based on the type of features defined on the substrate surface, the type of material used in the substrate and the characteristics of the precursor. In one embodiment, an aminosilane precursor is used as the first precursor. The first precursor reacts with the Silicon on the surface of the substrate and on the surfaces of the SOH features exposed to the first precursor to form Silicon-Hydrogen bonds, using a chemisorption process.

After exposing the surface of the substrate to the first precursor for a pre-defined period of time, the first precursor is removed from the process chamber using a purge operation. The purge operation may be a vacuum purge, wherein an inert gas is introduced into the process chamber for a pre-defined period of time and removed along with unabsorbed radicals of the first precursor and remaining portion of the first precursor.

After the purging operation, a second precursor having a weak oxidant is applied to the process chamber as plasma. The second precursor, in some implementations, is a Carbon dioxide (CO2) precursor, in which the CO2 is the weak oxidant. CO2 is a stable compound with strong bonds and is relatively difficult to disassociate easily in plasma. Therefore, using CO2 precursor would result in producing less reactive Oxygen radicals to saturate the surface of the substrate. The lower concentration of the reactive Oxygen radicals is sufficient to convert the surface Silicon-Hydrogen bonds formed by the first precursor on the surface of the substrate to Silanols without imparting much damage to the SOH features. Avoiding damage to the SOH features would adversely affect the critical dimensions of the SOH features formed on the substrate surface. The various implementations are not restricted to just CO2 precursor but can use any other weak oxidant precursor that is capable of providing sufficient Oxygen radicals without adversely affecting the critical features of the carbon-based SOH. The Oxygen radicals released into the plasma by the disassociated Carbon dioxide, readily react with the first precursor absorbed on the surface of the substrate to form an oxide film layer.

Figure 3B:
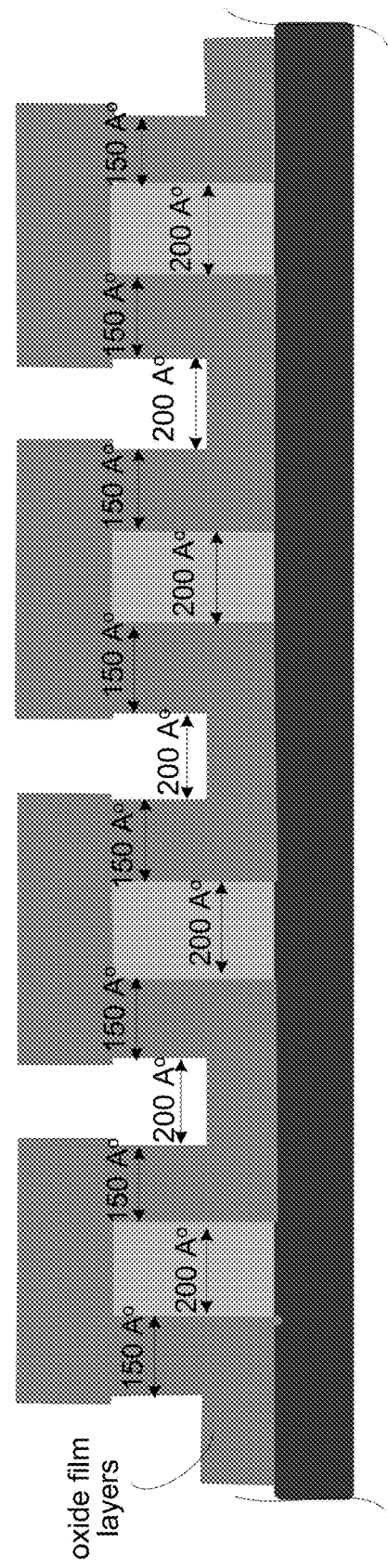

FIG. 3B illustrates an example of a resulting oxide film layer formed on the surface of the substrate as a result of exposure of the substrate surface and surfaces of the SOH features to the second precursor while substantially preserving critical dimensions of the SOH features. The second precursor is removed after a pre-defined period of time using a second purging operation wherein the excess Oxygen radicals and any byproducts of the second precursor are removed from the process chamber.

The process of processing the substrate surface and surfaces of the SOH features with a first precursor, purging the first precursor after a pre-defined period of time, processing the substrate surface and surfaces of the SOH features with a second precursor and purging the second precursor after a pre-defined period of time, defines an ALD deposition cycle. The ALD deposition cycle is repeated for a number of times in accordance to the atomic layer deposition process, so as to grow the oxide film layer to a particular oxide thickness on the substrate surface, and on surfaces (i.e., top surface and sidewalls) of the SOH features. The number of times the deposition cycle is repeated may be based on the critical dimensions of the SOH features and, as a result, the critical dimensions of the additional features that are being defined on the substrate surface using the double patterning technique. For example, the deposition cycle may be performed a defined number of times to grow the oxide film layer on the sidewalls of each of the features in the initial pattern to about 150 A° thickness so that a gap of about 200 A° exists between the two consecutive features. FIG. 3B illustrates an example wherein the oxide film layer is grown to about 150 A° thickness on the sidewalls of the features by the ALD process. Due to the low concentration of the reactive Oxygen radicals in the plasma, the amount of carbon-based SOH that is consumed is limited.

After the defined number of deposition cycles, a directional etching operation is performed to selectively remove the oxide film layer from the surface of the substrate and from a top of the SOH features so as to expose the top of the SOH features of the initial pattern. The directional etching leaves the oxide film layer formed on the sidewalls of the SOH pattern.

Figure 3C:
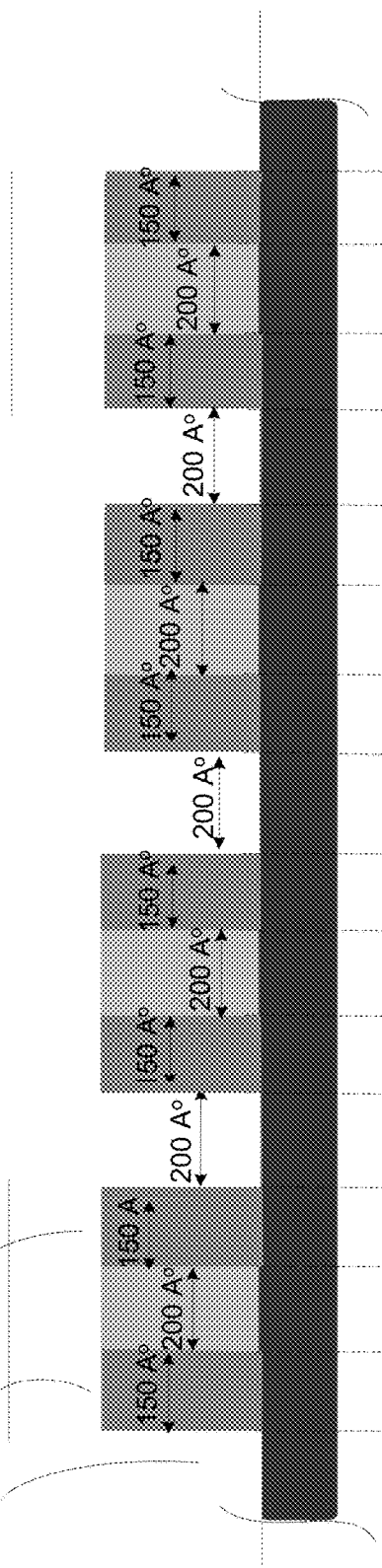

FIG. 3C shows the result of the directional etching operation wherein the sidewalls of the features have been preserved while a top of the SOH features is exposed. It should be noted that the dimensions in FIG. 3C may not be drawn to size but have been provided to illustrate the result of the ALD cycle on the features of the substrate.

Figure 3D:
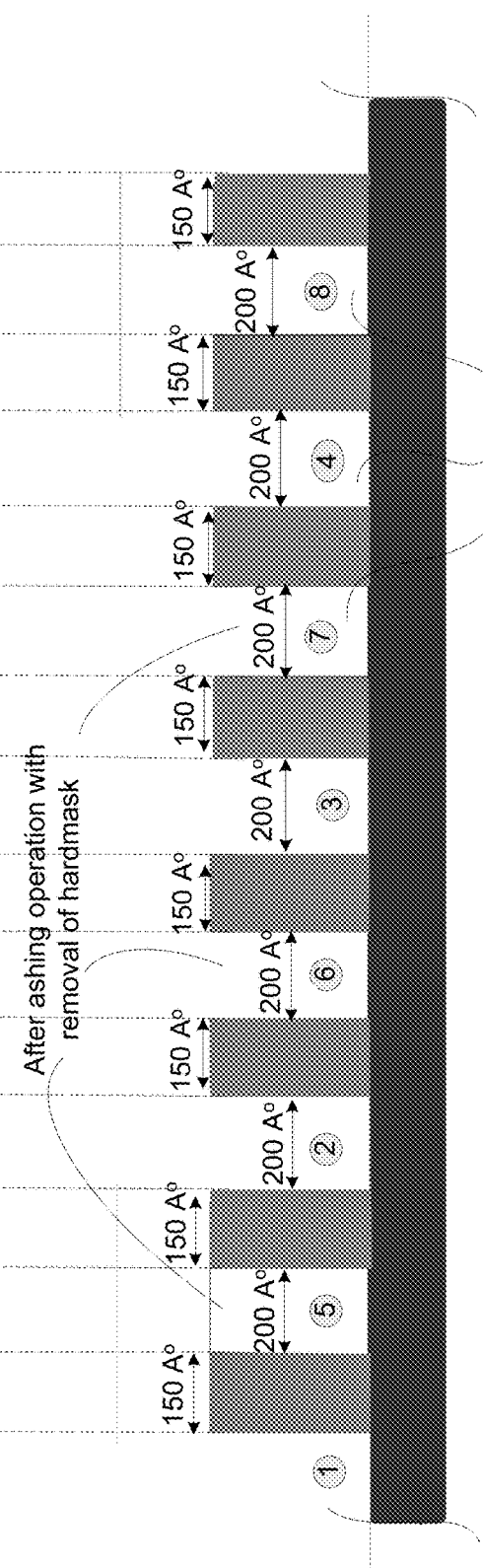

Finally, an ashing operation is performed to selectively remove the SOH from the features while leaving the oxide film layer forming the sidewalls. FIG. 3D shows the resulting pattern as a result of the ashing operation. The resulting pattern defines additional features formed on the substrate surface. The additional features essentially double the number of features of the initial pattern. Due to the low concentration of the oxidants provided by the weak oxidant, CO2, in the second precursor, less amount of carbon is consumed from the SOH features. As a result, the resulting gaps (i.e., gaps 1 through 4 from the initial pattern, and gaps 5-8 that were newly defined from the etching and ashing operations) between any pair of consecutive oxide film sidewalls defining double pattern have substantially uniform critical dimensions and the profiles of the etched features are highly planar. The resulting double pattern acts as a mask that is transferred to the substrate below in order to define features on the substrate during subsequent etching operation(s). The pattern that is transferred is regular and results in fairly consistent bar profile.

The following table shows the effect of the carbon consumption as a result of baseline ALD process using various oxidation chemistries in the second precursor.

|  | O2 used in 2ndary purge (in A°) | N2 used in 2ndary purge (in A°) | CO2 used in 2ndary purge (in A°) |
| --- | --- | --- | --- |
| Avg | 52.30 | 55.54 | 15.38 |
| NU | 22.07 | 24.12 | 31.04 |
| P1 | 16.97 | 25.32 | 9.55 |
| P2 | 14.86 | 14.66 | −1.06 |
| Range | 23.08 | 26.79 | 9.55 |

The first column in the table shows the various scan parameters used for determining the effect of the carbon consumption, the second column shows the effect of the Oxygen precursor on the features formed at different portions on the substrate, the third column shows the effect of the Nitrous Oxide precursor and the last column shows the effect of the Carbon dioxide precursor. On an average, about 52.30 A° depth of carbon-based SOH layer was consumed from the sidewalls of the features when the Oxygen precursor was used and about 55.54 A° depth of SOH layer was consumed from the sidewalls of the features when the Nitrous oxide precursor was used. In contrast, only about 15.38 A° depth of carbon-based SOH layer was consumed from the sidewalls of the features when the Carbon dioxide precursor was used, showing a significant decrease in the damage to the sidewalls that can be attributed to less amount of reactive Oxygen radicals present in the plasma of the Carbon dioxide precursor. By tuning the application parameters for the Carbon dioxide precursor, the depth of the carbon-based SOH layer consumed may be controlled further.

Similarly, the profile parameters P1 and P2 represent changes in the features profile formed on the substrate surface from the center of the substrate to the edge of the substrate. The range parameter shows the effect of the various precursors on the feature profile loss. The feature profile loss range for the Oxygen precursor and the Nitrous oxide precursor are fairly significant than the Carbon dioxide precursor, indicating that the Carbon dioxide precursor preserves the feature profile better than the Oxygen precursor and the Nitrous oxide precursor.

Figure 4:
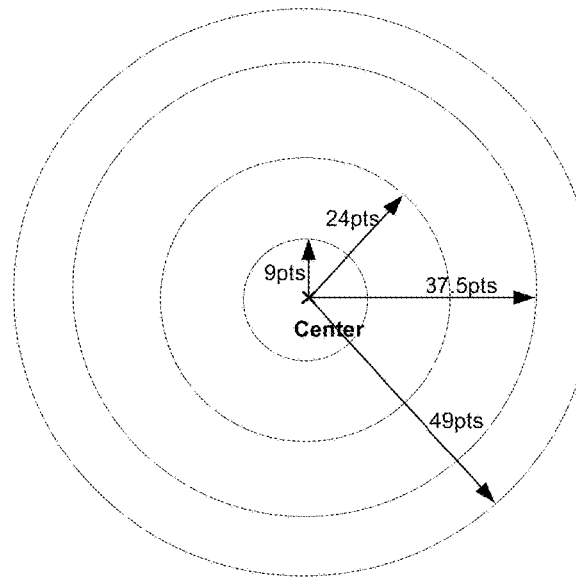
FIG. 4 illustrates radial scan to obtain surface profiles of the features resulting from SOH loss, in one implementation.
Figure 5:
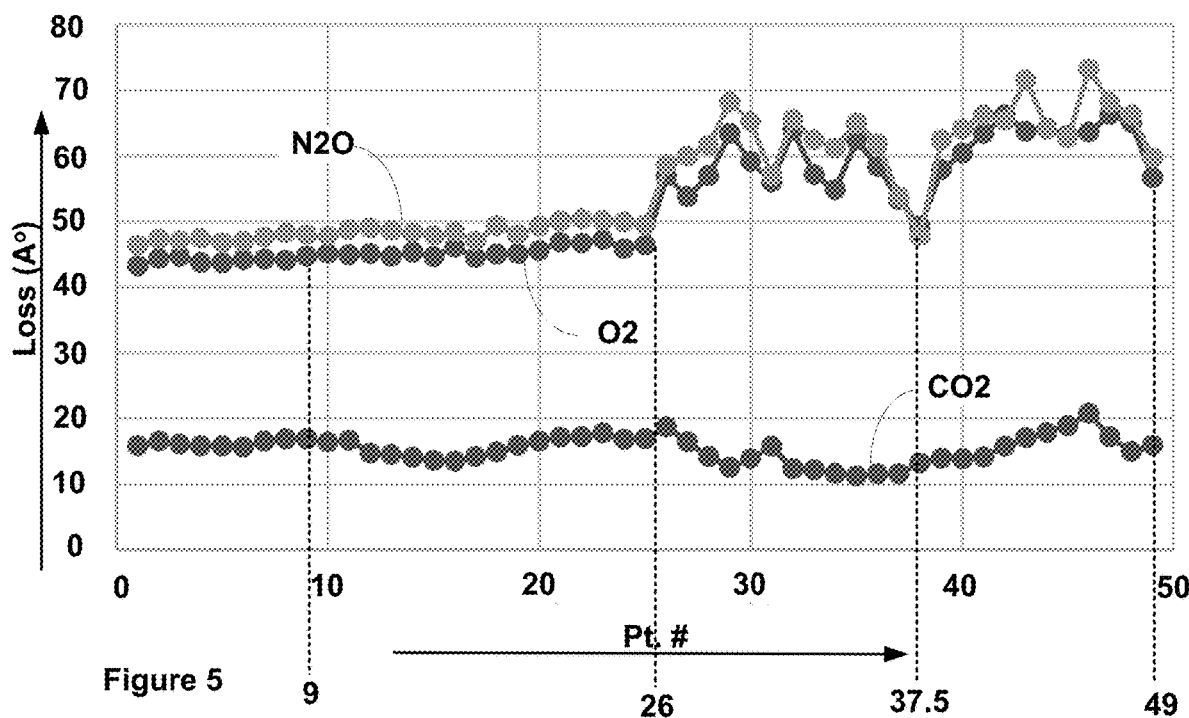
FIG. 5 illustrates a graph showing different plot lines corresponding to different scan points from the center of the wafer to show SOH loss based on the oxidizers used in the ALD process, in accordance with one implementation.

FIGS. 4 and 5 show feature profile changes for the various chemistries used in the ALD process at different scan points, in some implementation. FIG. 4 shows the scan points progressing from the center of the substrate to the edge of the substrate. FIG. 5 illustrates a graph plotting the feature profile changes (x-axis) measured at the corresponding scan points (shown in FIG. 4) as the feature profiles on the substrate surface are scanned radially starting from the center and out toward the edge versus carbon depletion at the SOH layer (y-axis). For example, for the first scan region covering a radius of about 9 points, the depletion of the carbon in the SOH layer for Oxygen precursor is shown to be about 45 A° and for Nitrous oxide precursor it was slightly higher to about 50 A°, while for CO2 it was shown to be about 15 A°. At the second scan region covering a radius of about 26 points, the carbon consumption for each of the Oxygen, Nitrous oxide and Carbon dioxide precursor remained fairly consistent with that of the first scan region.

The feature profile in the first scan region and the second scan region also showed a level of profile consistency. Although there was a level of feature profile consistency in the first and second scan regions, the SOH consumption at the first and second scan regions for the Oxygen and Nitrous oxide precursors were significantly higher than that of the CO2 precursor. At the third scan region covering a radius of about 37.5 points, the carbon consumption using the Oxygen and Nitrous oxide precursors showed an upward jump with highly non-uniform consumption (ranging between 48 A° to about 75 A°) at different points within the third scan region, as shown by the squiggly lines. Whereas, the carbon consumption due to the Carbon dioxide precursor showed a more stable profile characteristic that was similar in variation to what was observed in the first and second scan regions. The third scan region represents a regional transition from an inner region of the substrate to an outer region of the substrate.

At the edge of the substrate, the carbon consumption due to Oxygen and Nitrous oxide precursors showed the same non-uniformity shown in the third scan region while the CO2 precursor showed a small but steady increase, indicating a slight increase in the carbon consumption of the SOH features at the edge compared to the center of the substrate. This may be attributed to the way the second precursor is applied and removed from the process chamber and/or the varying amount of time the different portions of the substrate are exposed to the second precursor. Further, changing the precursor from Oxygen precursor to Nitrous oxide precursor did not improve or worsen the carbon-based SOH loss. On the other hand, the various scan regions using the CO2 precursor showed a more uniform feature profile and significantly less Carbon-based SOH loss than when a strong oxidant precursor (e.g., N2O or O2 precursor) was used. And the uniformity in the feature profile, based on the CO2 precursor, carried over from the center of the substrate to the edge without significant variation in the SOH consumption.

The application of the CO2 precursor can be tuned within the process input and control using the controller, to reduce the consumption of the carbon-based SOH. For instance, the standard process input and control that was used for applying the strong oxidant precursors can be used for the CO2 precursor to obtain a better feature profile on the substrate surface using the ALD process. Optimal feature profile can be realized by adjusting the flow rate of the various chemistries of the second precursor in accordance to the process recipe, using the controller. An example, a flow rate of the CO2 gas in the CO2 precursor that showed promising results was between about 500 standard cubic centimeter per minute (sccm) to about 3,000 sccm while the flow rate of the Argon gas was between about 5,000 sccm to about 20,000 sccm (i.e., a flow rate of Argon being adjusted to be about 10× times the flow rate of CO2 (1X)). In another example, the flow rate of CO2 was about 1,500 sccm and the flow rate of Argon was about 16,000 sccm.

Similarly, the temperature range in the process chamber can be maintained between about 30° C. to about 100° C., with an optimal temperature being about 50° C. Chamber pressure range can be adjusted to be between about 1 Torr to about 5 Torr with an optimal pressure of about 2 Torr. Power applied to the chamber ranged between about 250 watts to about 2,000 watts with a likely range of between about 500 watts to about 1,200 watts and an optimal power being about 1,000 watts. An example first precursor used in the ALD process was Aminosilane precursor and an example second precursor (i.e., weak oxidant precursor) is CO2 mixed with Argon. The ratio of the CO2 to Argon in the weak oxidant precursor was between about 1 unit of CO2 to about 2 or 3 units of Argon. The frequency of RF power applied to define the plasma is between about 10 MHz to about 15 MHz with an optimal RF power of about 13.56 MHz.

The width of the oxide film layer defined on the sidewalls of the feature is driven by the thickness of the SOH features and the pitch between the SOH features in the initial pattern that was defined on the substrate surface prior to the start of the ALD process. For example, when using a double patterning technique, the width of the oxide film layer is based on the width of the carbon-based SOH feature. Thus, if the thickness of the carbon-based SOH feature is about 200 A° and the pitch (i.e., spacing or gap) between a right edge of a first carbon-based SOH feature and a left edge of an adjacent second carbon-based SOH feature is about 500 A°, then the thickness of the sidewalls at the carbon-based SOH features can be defined to be about 150 A°, so that the spacing between the oxide film sidewalls of the two adjacent carbon-based SOH features is the same as the width of the carbon-based SOH feature itself (i.e., 200 A°). Thus, the number of ALD cycles that need to be performed depends on the pattern design.

The various embodiments are not restricted to the specific example of CO2-Argon precursor but could include any other weak oxidant mixed with Argon or any other inert gas(es). Similarly, different types of first precursor could be employed in the ALD cycle. The process chamber illustrated in FIG. 1 is one example of a single-station process chamber that was used to perform the ALD process and that other types of process chambers can be used, including multi-station process chambers. In the embodiment illustrated in FIG. 1, the power was delivered to the upper chamber portion while the lower chamber portion was grounded. Alternate embodiments wherein a process chamber that is configured to deliver the power to the lower chamber portion while the upper chamber portion is grounded, can also be employed.

The various embodiments discussed herein provide ways to optimally tune the application of the second precursor to reduce the amount of etch on the SOH features and to modulate the profile of the SOH features that are transferred to the substrate so that the resulting features etched in the substrate exhibit an uniform pattern. This is done by controlling the amount of reactive oxygen radicals released into the plasma by using a weak oxidant, such as CO2, that has strong bonds and is relatively difficult to break apart in the plasma. By providing less reactive radicals, the damage on the original carbon-based SOH features defined on the substrate surface can be limited, thereby preserving the critical dimension of the SOH features uniformly across the substrate surface. CO2 being a widely available compound offers a simple, inexpensive and effective way of preserving the SOH feature profiles. Transferring such uniform features to the substrate results in more uniform feature patterning.

Figure 6A:
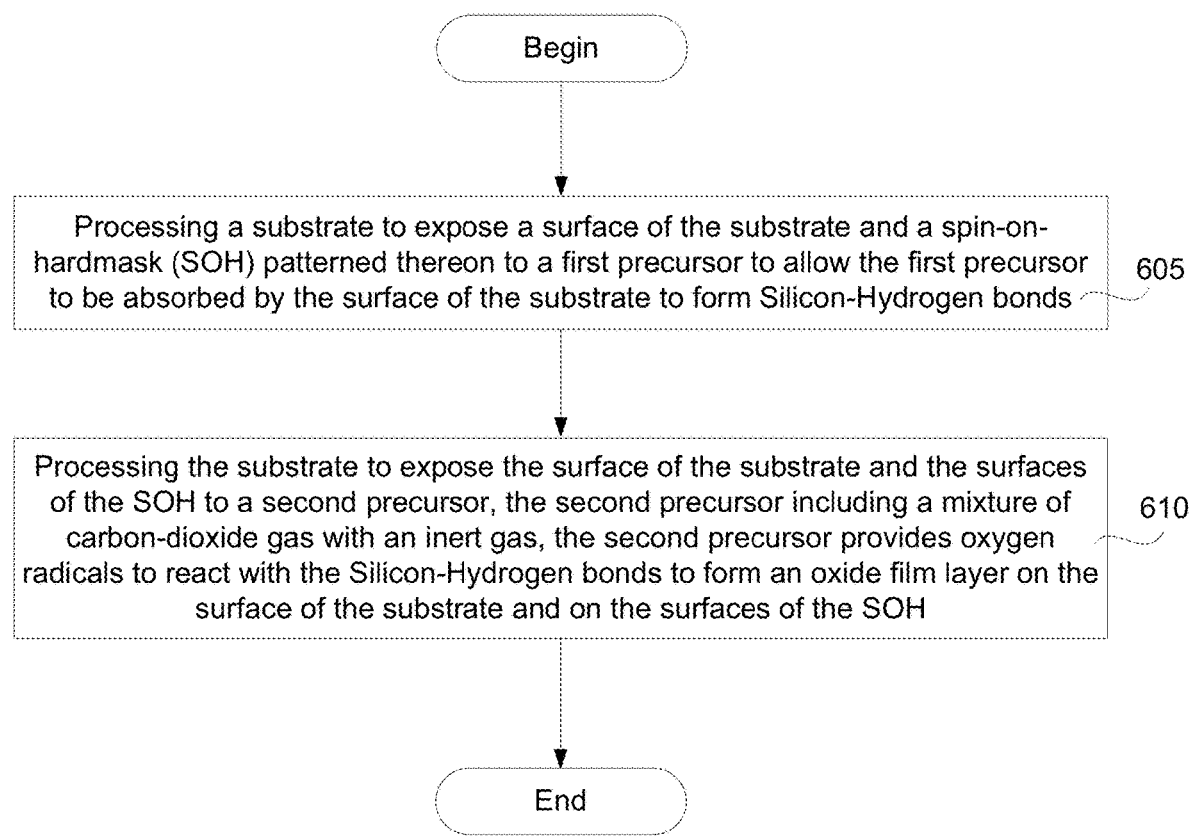
FIG. 6A illustrates operations of a method for defining thin oxide film layer on a substrate surface, in accordance with one implementation.

FIG. 6A illustrates process operations of a method used for forming oxide film layer on a surface of a substrate received in the process chamber. The process begins at operation 605, wherein the surface of the substrate is exposed to a first precursor via a first plasma. The surface of the substrate may have undergone a fabrication operation prior to being received in the process chamber for deposition operation. The fabrication operation may have been to define features of an initial pattern on the surface of the substrate. The features may be made of carbon-based hardmask. The first precursor is chosen based on type of features formed, type of substrate and type of hardmask used to form the features. In some implementation, the first precursor is an aminosilane precursor. The substrate is exposed to the first precursor for a pre-defined period of time to allow the first precursor to get absorbed to form Silicon-Hydrogen bonds on the surface of the substrate and on surfaces of the SOH formed on the surface of the substrate.

After the pre-defined period of time, the first precursor is purged and a second precursor is applied to the process chamber via second plasma, as illustrated in operation 610. The second precursor is different from the first precursor and includes Carbon dioxide mixed with an inert gas, such as Argon. The Carbon dioxide acts as a oxidizer and provides the Oxygen radicals to the plasma. The second precursor is applied in a controlled fashion by adjusting the flow rate of the various chemistries (e.g., Carbon dioxide and Argon) so as to allow the Oxygen radicals released from the Carbon dioxide to react with the Silicon-Hydrogen bonds formed on the surface of the substrate and on surfaces of the SOH in the initial pattern to define an oxide film layer. The amount of oxygen radicals released is sufficient to form the oxide film layer without substantially consuming a surface thickness of the initial pattern of the SOH. The oxide film layer formed by the reaction of the oxygen radicals with the first precursor is planar and uniform. The operations of exposing the surface of the substrate and the surfaces of the SOH of the initial pattern to the first precursor and the second precursor sequentially define an ALD deposition cycle. The ALD deposition cycle is repeated a number of times to grow the oxide film layer to an oxide thickness, in accordance to an atomic layer deposition process.

Figure 6B:
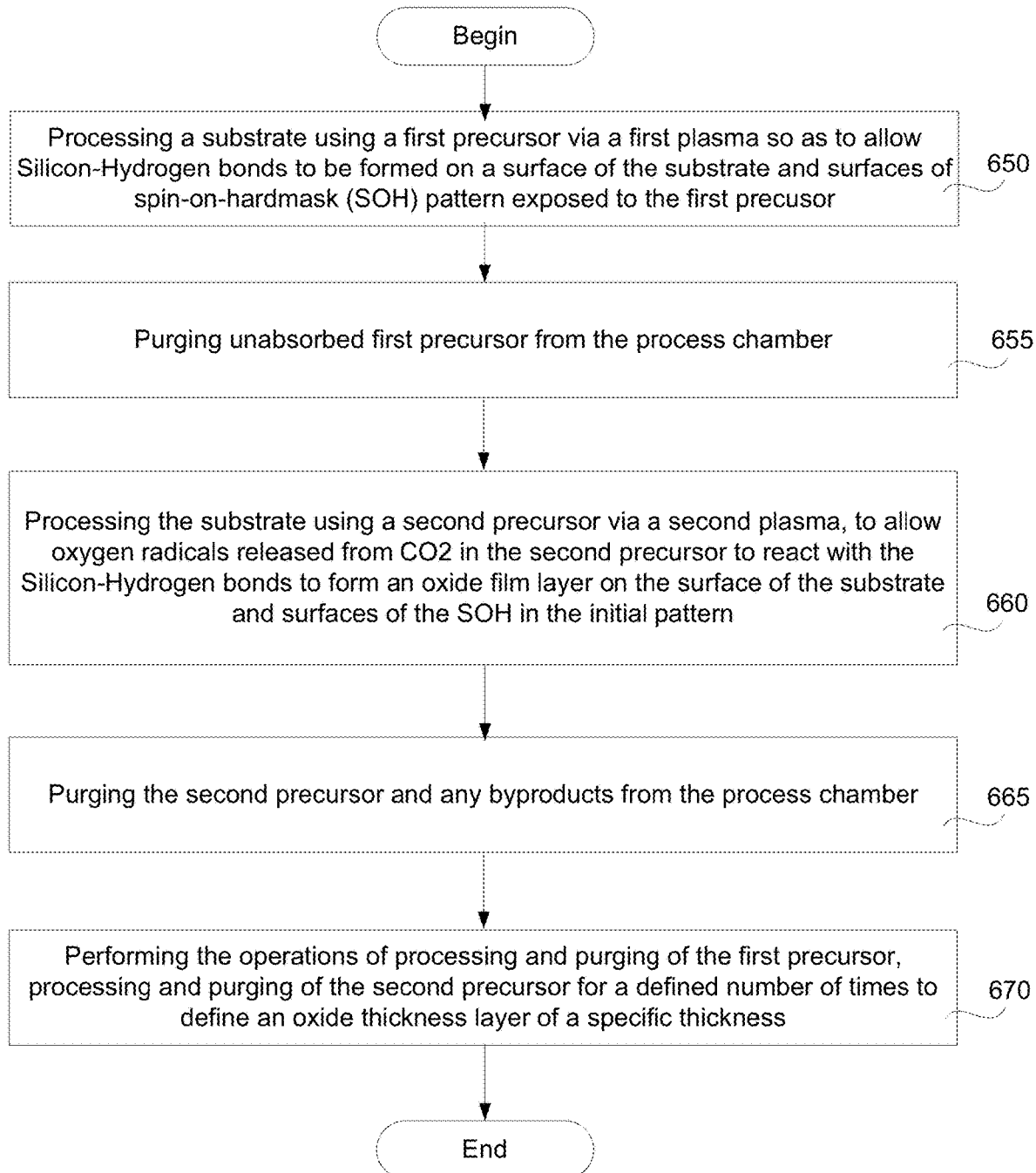
FIG. 6B illustrates operations of a method for defining thin oxide film layer on a substrate surface, in accordance with an alternate implementation.

FIG. 6B illustrates process operations of a method used for forming oxide film layer on a surface of a substrate received in the process chamber, in an alternate implementation. The process begins at operation 650, wherein a surface of a substrate is exposed to a first precursor via a first plasma. The surface of the substrate includes spin-on-hardmask (SOH) features of an initial pattern formed thereon. The first precursor is exposed to the surface of the substrate for a pre-defined period of time to allow the first precursor to get partially absorbed on the surface of the substrate and surfaces of the SOH features to form Silicon-Hydrogen bonds. After the pre-defined period of time, a purge operation is performed to remove any unabsorbed first precursor from the process chamber, as illustrated in operation 655.

A second precursor is applied via a second plasma to expose the surface of the substrate and surfaces of the SOH feature to the second precursor, as illustrated in operation 660. The second precursor is different form the first precursor and includes a mixture of Carbon-dioxide gas and an inert gas. The Carbon-dioxide gas is a weak oxidant and acts as an oxidizer. The oxygen radicals released from the Carbon-dioxide gas into the plasma reacts with the Silicon-Hydrogen bonds formed on the surface of the substrate and surfaces of the SOH features to form an oxide film layer on the surface of the substrate. The oxide film layer is formed without substantially consuming a surface thickness of the initial pattern of the SOH.

A second purge operation is performed, as illustrated in operation 665, to remove the left over second precursor and any byproducts formed in the plasma, from the process chamber. The operations of processing the surface of the substrate with the first precursor, purging the first precursor from the process chamber, processing with the second precursor, and purging the second precursor and any other byproducts out of the process chamber, are repeated for a defined number of times so as to grow the oxide film layer to an oxide thickness over the surface of the substrate and the surfaces of the initial pattern of the SOH, as illustrated in operation 670. The number of times the operations are carried out may be based on critical dimension of the features and a pitch between the SOH features defined in the initial pattern.

The process may further include selectively etching the oxide film layer to expose a top of the initial pattern of the SOH and the surface of the substrate while leaving the oxide film layer on the sidewalls of the SOH features. Additionally, an ashing operation may be performed to remove hardmask from the initial pattern and to leave oxide sidewalls from the oxide film layer. The oxide sidewalls left behind by the ashing operation defines a self-aligned double pattern. The self-aligned double pattern acts as a mask that can be transferred to the substrate below to define the features during subsequent etching operation(s).

The process operations illustrated in FIGS. 6A and 6B are part of a double patterning technique as the number of features in the resulting pattern at the end of the ashing operation of the ALD process is double the number of features in the initial pattern. The features formed from the double patterning are highly planar and sufficiently uniform. Further, due to limited oxygen radicals in the plasma, the consumption of the carbon-based hardmask is limited, thereby preserving the critical dimensions of the SOH features of the initial pattern. As the Carbon dioxide contributes low reactive radical species in plasma, the usage of the CO2 as the oxidant gas in the ALD deposition cycle allows for much more limited damage to the SOH. As the device sizes are shrinking, limiting the damage of the SOH helps in maintaining the critical dimension between features.

The CO2 is co-flowed with Ar and plasma is struck using high-frequency radio-frequency power to provide sufficient conversion of surface Si—H to silanols, as such facilitate the step-wise film layer growth that is intrinsic to ALD processes. Such step-wise layer growth is accomplished using existing tools that can be used to apply CO2 precursor into the process chamber instead of the O2 precursor or N2O precursor, and the deposition of the oxide film layer is effectuated with similar cycle times as that of the O2 precursor or N2O precursor. The resulting etch-profile of the features using the CO2 precursor is highly planar, unlike that of the features using the O2 precursor or N2O precursor. Additionally, the usage of the CO2 chemistry in the second precursor is simple and easily implementable. CO2 is a widely available inexpensive gas that poses minimal challenges in safe handling, making this a very effective and efficient solution to overcome the non-planar and non-uniform feature profile issues of the conventional ALD process. These and other advantages will be appreciated by those skilled in the art upon reading the entire specification and the claims.

Figure 7:
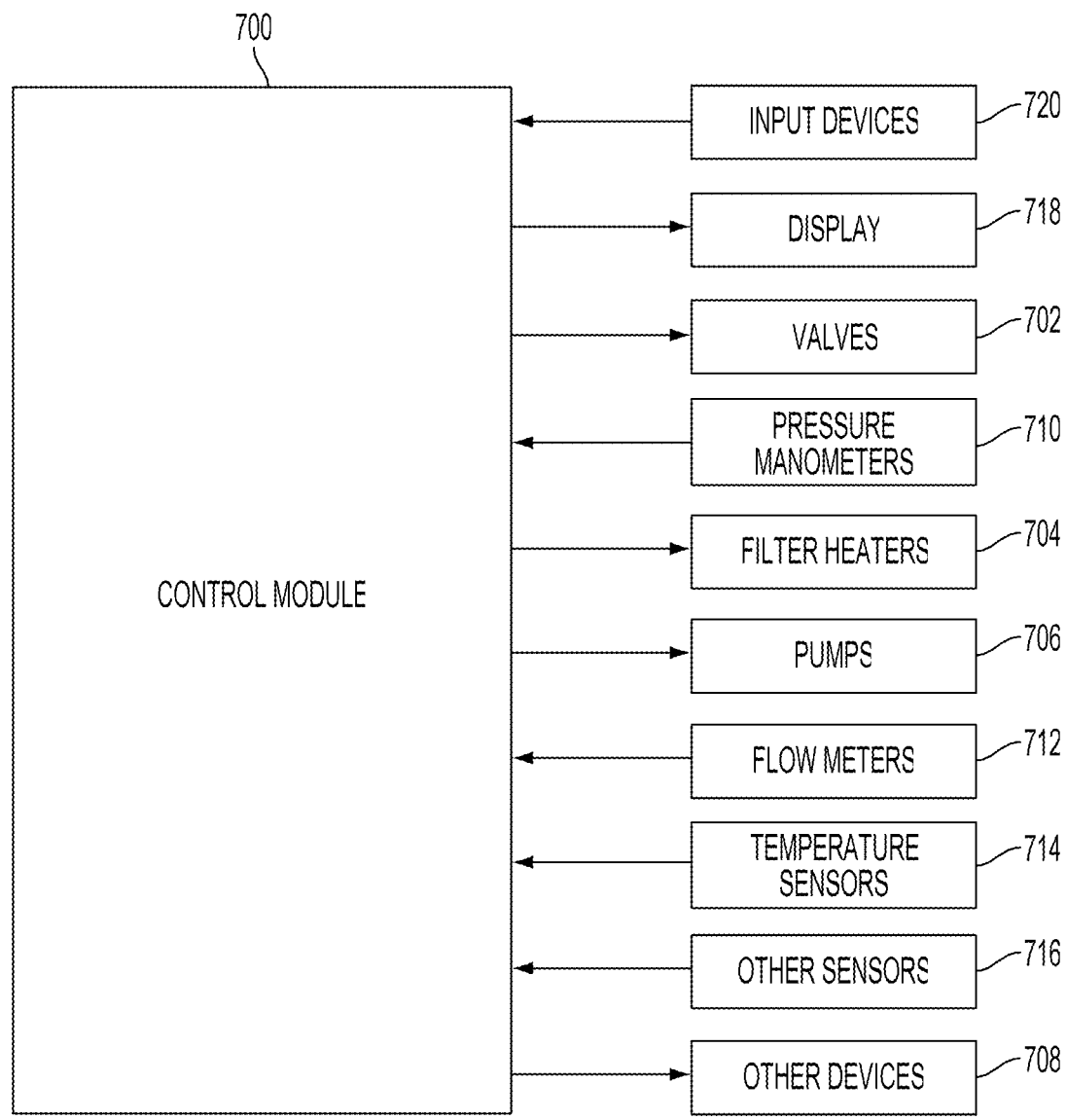
FIG. 7 shows a control module for controlling the systems, in accordance with one embodiment.

FIG. 7 shows a control module 700 for controlling process input and control of the process chamber. In one embodiment, the control module may include some example components. For instance, the control module 700 may include a processor, memory and one or more interfaces. The control module 700 may be employed to process recipes, control devices of the process chamber based in part on sensed values. For example only, the control module 700 may control one or more of valves 702, filter heaters 704, pumps 706, and other devices 708 based on the sensed values and other control parameters. The control module 700 receives the sensed values from, for example only, pressure manometers 710, flow meters 712, temperature sensors 714, and/or other sensors 716. The control module 700 may also be employed to control process conditions during precursor delivery and deposition of the film. The control module 700 will typically include one or more memory devices and one or more processors.

The control module 700 may control activities of the precursor delivery system and deposition apparatus. The control module 700 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, flow rates, and other parameters of a particular process. The control module 700 may also monitor the pressure differential and automatically switch vapor precursor delivery from one or more paths to one or more other paths. Other computer programs stored on memory devices associated with the control module 700 may be employed in some embodiments.

Typically there will be a user interface associated with the control module 700. The user interface may include a display 718 (e.g. a display screen and/or graphical software displays of the apparatus and/or process conditions), and user input devices 720 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 710, and thermocouples located in delivery system, the pedestal or chuck (e.g. the temperature sensors 714). Appropriately programmed feedback and control algorithms may be used with data from these sensors to maintain desired process conditions. The foregoing describes implementation of embodiments of the disclosure in a single or multi-chamber semiconductor processing tool or process chamber.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A method for processing a substrate in a process chamber, the substrate having an initial pattern of spin-on-hardmask (SOH) defined on a surface of the substrate, the method comprising:
    exposing the surface of the substrate with the initial pattern of spin-on-hardmask (SOH) to a sequential operation for a defined number of times to form an oxide film layer of a thickness, wherein the sequential operation includes treating the surface with a first precursor followed by a second precursor, and wherein treating with the second precursor includes co-flowing a weak oxidant with an inert gas;
    directionally etching the oxide film layer to expose a top of the SOH of the initial pattern and the surface of the substrate; and
    performing an ashing operation to remove the SOH of the initial pattern to leave oxide sidewalls, the oxide sidewalls defining a self-aligned double pattern.

2. The method of claim 1, wherein treating with the first precursor includes,
    exposing the surface of the substrate to a first plasma so as to allow the first precursor to be partially absorbed on the surface of the substrate to form Silicon-Hydrogen bonds; and
    wherein treating with the second precursor includes, exposing the surface of the substrate to a second plasma of the weak oxidant and the inert gas so as to cause oxygen radicals released from the weak oxidant of the second precursor to react with Silicon-Hydrogen bonds formed on the surface of the substrate to define the oxide film layer.

3. The method of claim 2, wherein power applied to the process chamber to generate second plasma is between about 250 watts to about 2000 watts.

4. The method of claim 1, further includes performing a purging operation of the first precursor from the process chamber prior to introducing the second precursor into the process chamber.

5. The method of claim 1, further includes performing a purging operation of the second precursor after exposing the surface of the substrate and the surfaces of the SOH to the second precursor for a predefined period of time.

6. The method of claim 1, wherein the inert gas is Argon.

7. The method of claim 1, wherein the co-flowing includes adjusting a flow rate of the inert gas to be at about 10 times a flow rate of the weak oxidant.

8. The method of claim 7, wherein the flow rate of the weak oxidant is adjusted to be between about 500 standard cubic centimeters per minute (sccm) and about 3000 sccm, and the flow rate of the inert gas is adjusted to be between about 5000 sccm and about 20,000 sccm.

9. The method of claim 1, wherein the number of times the sequential operation is performed is determined based on a thickness of the SOH in the initial pattern and a thickness of the oxide film layer formed from each sequential operation.

10. The method of claim 1, wherein the number of times the sequential operation is performed is based on pitch of the SOH in the initial pattern.

11. The method of claim 1, wherein the SOH defined in the initial pattern is a carbon-based hardmask.

12. The method of claim 1, wherein the weak oxidant is carbon-dioxide gas.

13. The method of claim 1, wherein a ratio of the inert gas to the weak oxidant in the second precursor is about 2 times or 3 times an amount of the weak oxidant.

14. The method of claim 1, wherein a temperature within the process chamber is between about 30° C. to about 100° C., and
wherein a pressure in the process chamber is between about 1 Torr and about 5 Torr.

15. The method of claim 1, wherein the first precursor is an organometallic silicon precursor.

16. The method of claim 1, wherein the first precursor is Aminosilane precursor.

* * * * *